United States Patent
Prajapati et al.

(10) Patent No.: US 8,969,216 B2
(45) Date of Patent: Mar. 3, 2015

(54) METHOD FOR SINGLE SIDE TEXTURING

(75) Inventors: Victor Prajapati, Providence, RI (US); Joachim John, Leuven (BE)

(73) Assignees: IMEC (BE); Katholieke Universiteit Leuven, K.U. Leuven R&D (BE)

( * ) Notice: Subject to any disclaimer, the term of this patent is extended or adjusted under 35 U.S.C. 154(b) by 0 days.

(21) Appl. No.: 13/576,925

(22) PCT Filed: Feb. 11, 2011

(86) PCT No.: PCT/EP2011/052009
§ 371 (c)(1), (2), (4) Date: Aug. 2, 2012

(87) PCT Pub. No.: WO2011/098549
PCT Pub. Date: Aug. 18, 2011

(65) Prior Publication Data
US 2012/0295446 A1    Nov. 22, 2012

Related U.S. Application Data

(60) Provisional application No. 61/303,445, filed on Feb. 11, 2010.

(51) Int. Cl.
| | | |
|---|---|---|
| H01L 21/302 | (2006.01) | |
| H01L 21/461 | (2006.01) | |
| B44C 1/22 | (2006.01) | |
| C03C 15/00 | (2006.01) | |
| C03C 25/68 | (2006.01) | |
| H01L 31/0236 | (2006.01) | |

(52) U.S. Cl.
CPC ........... *H01L 31/0236* (2013.01); *Y02E 10/50* (2013.01)

USPC ........... 438/745; 438/689; 438/690; 438/691; 438/692; 438/693; 438/750; 216/52; 216/53; 216/88; 216/89

(58) Field of Classification Search
None
See application file for complete search history.

(56) References Cited

U.S. PATENT DOCUMENTS

2006/0283539 A1* 12/2006 Slafer ........................... 156/230

FOREIGN PATENT DOCUMENTS

| | | | |
|---|---|---|---|
| EP | 2278632 A1 | 1/2011 | |
| JP | 2006-073832 | * 3/2006 | ............ H01L 31/04 |
| JP | 2006-073832 A | 3/2006 | |
| JP | 2009-246019 A | 10/2009 | |
| WO | WO 2009/133607 A1 | 11/2009 | |

OTHER PUBLICATIONS

Neuhaus et al, Industrial Silicon Wafer Solar Cells, Sep. 2007, Advacnes in OptoElectronics, vol. 2007, pp. 1-15.*

(Continued)

*Primary Examiner* — Stephanie Duclair
(74) *Attorney, Agent, or Firm* — Knobbe Martens Olson & Bear LLP

(57) ABSTRACT

A method for single side texturing of a crystalline semiconductor substrate (10) comprises: providing a substrate (10), for example a semiconductor substrate, comprising a first surface (12) and a second surface (14) opposite to one another with respect to the substrate (10); providing a masking layer (21) with a random pattern on the first surface (12) of the substrate (10); and etching the substrate (10) in a polishing solution, thereby texturing the first surface (12) of the substrate (10) and polishing the second surface (14) in a single wet etching step.

18 Claims, 3 Drawing Sheets

(56) References Cited

OTHER PUBLICATIONS

Lin et al., "Fast Nano-Scale Texturing Using the Self-Assembly Polymer Mask and Wet Chemical Etching" Photovoltaic Specialists Conference (PVSC), 2009 34+IEEE, IEEE, Piscataway, NJ, USA, Jun. 7, 2009, pp. 1-5, XP031626938.

Prajapati et al., "Advanced Approach for Surface Decoupling in Crystalline Silicon Solar Cells" 2010 35$^{th}$ IEEE, IEEE, Piscataway, NJ, USA, Jun. 20-25, 2010, Honolulu, HI, USA, Jun. 20, 2010, pp. 902-905, XP031783967.

* cited by examiner

METHOD FOR SINGLE SIDE TEXTURING

CROSS-REFERENCE TO RELATED APPLICATIONS

This application is the national phase under 35 U.S.C. §371 of prior PCT International Application No. PCT/EP2011/052009 which has an International Filing Date of Feb. 11, 2011, which designates the United States of America, and which claims priority to U.S. Provisional Application No. 61/303,445 filed Feb. 11, 2010, the disclosures of which are hereby expressly incorporated by reference in their entirety and are hereby expressly made a portion of this application.

FIELD OF THE INVENTION

The present invention relates to a method for single side texturing of crystalline semiconductor substrates, such as e.g. crystalline silicon substrates.

BACKGROUND OF THE INVENTION

Methods for surface texturing used in the photovoltaic industry are often time consuming and inefficient. In order to obtain photovoltaic cells with high conversion efficiency, one side (e.g. the front side or front surface) of the cells is preferably textured while the other side (e.g. the rear side) is polished. The front side is textured to substantially reduce light reflection such that a substantial amount of the incident light is captured by the photovoltaic cell. The rear side is polished such that it can act as a mirror for reflecting light (e.g. infrared light) that passes through the substrate without being absorbed. The light reflected at the rear side can pass a second time through the substrate, thereby increasing the chances of being absorbed and creating charge carriers.

In industrial manufacturing processes for high efficiency silicon photovoltaic cells, the front silicon surface is generally textured by means of wet chemical etching. For example, alkaline based solutions such as KOH/IPA or NaOH/IPA (IPA: Isopropyl alcohol) based solutions are used for texturing monocrystalline silicon substrates. For multicrystalline silicon substrates $HF/HNO_3$ mixtures are often used for texturing.

In a typical industrial process, starting from as-cut silicon wafers, first a saw damage removal (SDR) step is performed, typically removing a silicon layer of about 10 micrometer thickness at both sides of the wafers. Next, both sides are textured by wet etching, thereby removing typically about 5 micrometer of silicon at both sides of the wafers. Subsequently the rear side of the wafers is polished using a one-side polishing process, e.g. a 'floating wafer' process wherein only the rear side of the wafers is submerged in an etching solution. This results in an additional removal of typically 10 micrometer of silicon. Such a process sequence results in a reduction of the silicon wafer thickness with typically 40 micrometer. This means that for industrial silicon wafer thicknesses of 180 micrometer, the silicon loss is more that 20%. In addition to the silicon loss the wet processing is rather time consuming and hinders high throughput processing that is required for cost effective photovoltaic cell processing.

The silicon loss can be reduced by providing a masking layer, e.g. a dielectric layer, at the rear side of the substrate after saw damage removal and before the texturing step. Using such an approach, the reduction of the silicon wafer thickness can be limited to typically 25 micrometer. However, it requires an additional process step for providing the masking layer.

Another method that can be used for single side texturing is plasma texturing (dry etching). Although it is a one sided process that can be scaled up to increase throughput, a wet etching step is still required for polishing the rear side to ensure removal of saw damage.

SUMMARY OF THE INVENTION

It is an object of embodiments of the present invention to provide a method for texturing a first surface of a semiconductor, e.g. silicon, substrate and polishing a second surface of the semiconductor, e.g. silicon, substrate, the second surface being opposite to the first surface, wherein the amount of silicon removed is limited, for example smaller than in prior art methods.

The above objective is accomplished by a method according to embodiments of the present invention.

In one aspect, embodiments of the present invention provide a method for single side texturing of a crystalline semiconductor substrate, the method comprising: providing a substrate, for example a semiconductor substrate such as a crystalline semiconductor substrate comprising a first surface and a second surface opposite to one another with respect to the substrate; providing a masking layer with a random pattern on the first surface of the substrate; and etching the substrate in a polishing solution, thereby texturing the first surface of the substrate and polishing the second surface opposite to the first surface in a single wet etching step. The substrate, e.g. crystalline semiconductor substrate can for example be a crystalline silicon substrate.

It is an advantage of a method according to embodiments of the present invention that it is fast in view of the polishing step of the second surface and the texturing step of the first surface being carried out in a single step. Hence a method according to embodiments of the present invention may for example be less time consuming than prior art methods, thus allowing a higher throughput and more cost effective photovoltaic cell processing.

Providing a semiconductor substrate may comprise providing a substrate, e.g. a semiconductor substrate, having a non-polished or rough first and/or second surface. For example, the substrate may be an as-cut silicon wafer, obtained for example by wire sawing the substrate from an ingot. This has the advantage that pre-processing of the substrates is reduced or not required at all. In cases where one would start with a polished wafer, a short prior art texturing step could be performed first, for example using KOH/IPA as used in prior art texturing processes, such that the initially polished surfaces become rough. The prior art texturing step can last just long enough to create some surface roughness. It does not need to last so long as to provide a good surface texturing as required e.g. for photovoltaic cells. After this prior art texturing step, a method according to embodiments of the present invention can be performed, leading to a polished rear surface and a textured front surface without the need for providing a masking layer at the rear side of the substrate before performing the texturing step according to embodiments of the present invention.

Providing a masking layer with a random pattern on the first surface, i.e. a masking layer having a pattern with randomly distributed features, can comprise providing an adhesive layer on the first surface and subsequently removing the adhesive layer, thereby leaving randomly distributed traces of the adhesive layer on the first surface. The adhesive layer may for example be an organic adhesive layer.

In particular embodiments, the adhesive layer may be an adhesive tape. This way of working is very simple and not very time consuming. The adhesive layer may then for example be provided from a roll-to-roll sheet. Removing the adhesive layer from the first surface of the substrate may comprise leaving traces of the adhesive layer on the first surface of the substrate. These traces may be left in a random pattern. In particular embodiments, where the first surface already shows some roughness, the random pattern may be correlated to the roughness of the substrate.

Alternatively, providing a masking layer with a random pattern can comprise spraying a masking layer on the first surface. According to yet alternative embodiments, providing a masking layer with a random pattern can comprise providing the masking layer by means of a roller. Also any other method for providing a masking layer with a random pattern known by a person skilled in the art and suitable for obtaining the desired features may be used.

Providing an adhesive layer on the first surface of the substrate may comprise providing the adhesive layer on the first surface of the substrate at room temperature.

Etching the substrate in a polishing solution can for example comprise etching the substrate in an alkaline solution such as a NaOH based polishing solution or a KOH based polishing solution, for example a NaOH:H2O or a KOH:H2O solution. The NaOH concentration or the KOH concentration may be in the range between 5% and 45%, e.g. in the range between 10% and 40%, for example in the range between 15% and 30%. Etching the substrate in a polishing solution may be performed at a temperature between 60° C. and 95° C., for example between 70° C. and 90° C. Etching the substrate in a polishing solution may be performed with an etching time between 1 minute and 45 minutes, for example between 2 minutes and 30 minutes, for example between 2 minutes and 10 minutes.

Because of the absence of a masking layer at the rear side of the substrate, the etching step results in a polished rear side. Due to the presence of a random masking layer at the front side of the substrate, the etching step results in a textured front side, e.g. a randomly textured front side. As etching times are not extremely long, removal of substrate material due to etching is limited, and the thickness of the substrate may be reduced with less than 20% during the etching step, e.g. with less than 10%. Hence thinner wafers can be used to start from, leading to reduction of material consumption.

In a second aspect, the present invention provides a single side textured substrate manufactured in accordance with a method according to embodiments of the first aspect of the present invention. The present invention also provides a photovoltaic cell comprising a single side textured substrate according to embodiments of the present invention.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the invention as claimed. The invention, both as to organization and method of operation, together with features and advantages thereof, may best be understood by reference to the following detailed description when read in conjunction with the accompanying drawings.

Particular and preferred aspects of the invention are set out in the accompanying independent and dependent claims. Features from the dependent claims may be combined with features of the independent claims and with features of other dependent claims as appropriate and not merely as explicitly set out in the claims.

Figure 1:
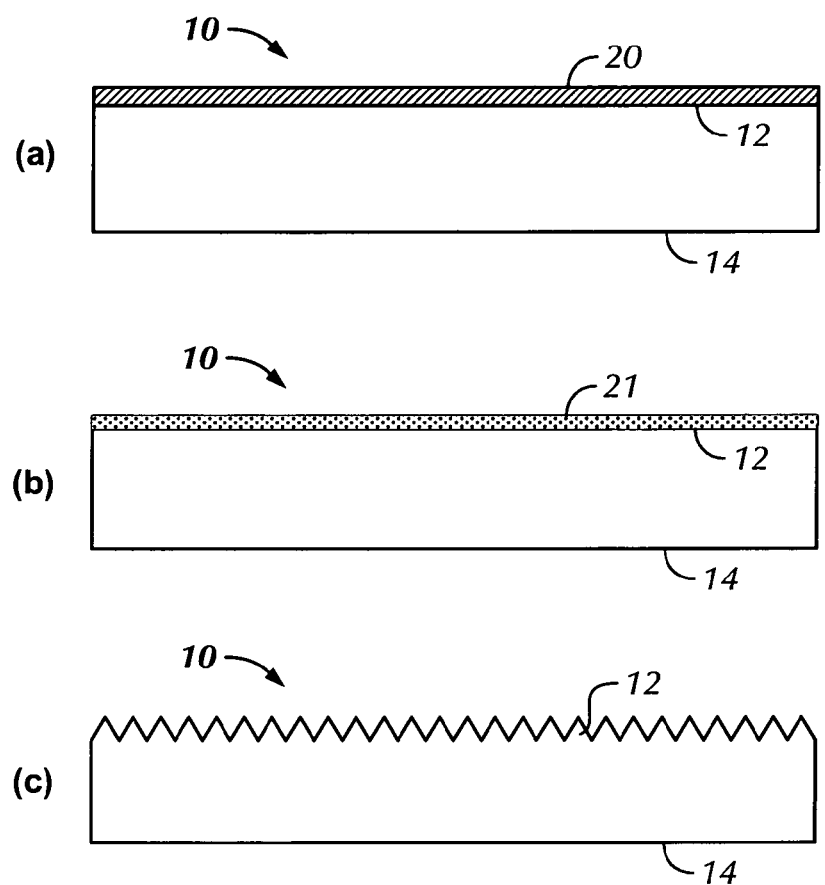
FIG. 1 schematically illustrates a method according to an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

In the following detailed description, numerous specific details are set forth in order to provide a thorough understanding of the invention and how it may be practiced in particular embodiments. However, it will be understood that embodiments of the present invention may be practiced without these specific details. In other instances, well-known methods, procedures and techniques have not been described in detail, so as not to obscure the present invention. While the present invention will be described with respect to particular embodiments and with reference to certain drawings, the invention is not limited hereto. The drawings included and described herein are schematic and are not limiting the scope of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present invention, the front surface, front side, first surface or first side of a photovoltaic cell is the surface or side adapted for being oriented towards a light source and thus for receiving illumination. The back surface, back side, rear surface, rear side, second surface or second side of a photovoltaic cell is the surface or side, with respect to a substrate forming the photovoltaic cell, opposite to the front surface. In the context of the present invention, the back surface, back side, rear surface, rear side, second surface or second side is the surface or side of the photovoltaic cell adapted for reflecting light that passes through the substrate without being absorbed. Furthermore, in the context of the present invention, the front surface, front side, first surface or first side of a photovoltaic cell substrate is the surface or side of the substrate adapted for being oriented towards a light source. The back surface, back side, rear surface, rear side, second surface or second side of a photovoltaic cell substrate is the surface or side opposed to the front surface of the substrate.

Embodiments of the present invention provide a method for texturing a first surface of a substrate, e.g. a semiconductor substrate such as for example a silicon substrate and polishing a second surface of the substrate, the second surface being opposite to the first surface. The method according to embodiments of the present invention is based on a wet etching process. It is an advantage of a method according to embodiments of the present invention that the amount of substrate material, e.g. semiconductor material such as for example silicon removed is smaller than in prior art wet-etching based methods for front side texturing and rear side polishing. Furthermore, the method of the present invention is less time consuming than prior art methods, thus allowing a higher throughput and more cost effective photovoltaic cell processing.

A method for single side texturing of a crystalline semiconductor substrate, such as a crystalline silicon substrate, is provided. The method of the present invention comprises: providing a crystalline semiconductor substrate, e.g. a crystalline silicon substrate; providing a masking layer with a random pattern at a first surface of the semiconductor substrate; and etching the substrate in a polishing solution, thereby texturing the first surface of the substrate and polishing a second surface opposite to the first surface in a single etching step. Providing a crystalline semiconductor substrate may comprise providing a semiconductor substrate having a non-polished or rough first surface. For example, the substrate may be an as-cut silicon wafer. Providing a masking layer with a random pattern can comprise providing an adhesive layer on the first surface and subsequently removing the adhesive layer, thereby leaving randomly distributed traces of the adhesive layer on the first surface. Alternatively, providing a masking layer with a random pattern can comprise spraying a masking layer on the first surface. Any other method known by a person skilled in the art for providing a random masking layer may be used. Etching the wafer in a polishing solution can for example comprise etching the wafer in an alkaline polishing solution such as a NaOH based polishing solution or a KOH based polishing solution.

A method according to an exemplary embodiment of the present invention is schematically illustrated in FIG. 1. As a starting material, a substrate 10, such as a semiconductor substrate e.g. a silicon wafer 10, is provided, having a first surface 12 and a second surface 14 opposite to the first surface 12 with respect to the substrate. The first surface 12 and the second surface 14 may be rough, non-polished surfaces. For example, a semiconductor, e.g. silicon, as-cut wafer can be used, obtained e.g. by wire sawing from a semiconductor, e.g. silicon, ingot. The surface of such an as-cut semiconductor, e.g. silicon, wafer is rough and contaminated with impurities, e.g. metal impurities from the slurry and the metal wire used during the wafering step (wire sawing).

In a first step of a method according to embodiments of the present invention, illustrated in FIG. 1($a$), a masking layer is provided on the first surface 12 of the substrate 10. In particular embodiments, as illustrated in FIG. 1, the masking layer may be an adhesive layer 20 such as for example an organic adhesive layer or an adhesive tape, which is provided on the first surface 12 of the substrate, e.g. of the rough silicon wafer 10. The masking layer, e.g. adhesive layer 20, may be provided at room temperature. It is an advantage of using such an adhesive layer 20 (e.g. an adhesive tape) that it can be provided fast and at low cost. For example, an adhesive layer can be provided on the wafer from a roll-to-roll sheet, the wafer e.g. being held by vacuum. The roll of adhesive could provide sufficient pressure to obtain good coverage of the wafer surface.

In a next step the masking layer is provided with a random pattern. In the embodiment illustrated in FIG. 1($a$) the masking layer was an adhesive layer, and in the step illustrated in FIG. 1($b$), the adhesive layer is removed, thereby leaving traces 21 of the adhesive layer on the first surface 12 of the substrate, e.g. the as cut silicon wafer 10. These traces form an irregular or random pattern, e.g. correlated to the roughness of the rough substrate, e.g. the as-cut silicon surface. For example, a roll-to-roll process can be used for providing and shortly afterwards removing the adhesive layer.

Next the wafer is etched in a polishing solution, such as for example an alkaline polishing solution, e.g. a solution comprising NaOH or KOH. For example, a NaOH:H$_2$O or a KOH:H$_2$O solution can be used wherein the NaOH concentration or the KOH concentration is in the range between 5% and 45%, e.g. in the range between 10% and 40%, e.g. in the range between 15% and 30%. The etching temperature can for example be in the range between 60° C. and 95° C., for example between 70° C. and 90° C. The etching time can for example be in the range between 1 minute and 45 minutes, e.g. in the range between 2 minutes and 30 minutes, e.g. in the range between 2 minutes and 10 minutes. For example, 20 weight % of NaOH or KOH in H$_2$O can be used, at a temperature of 80° C. and with an etching time of 5 minutes. Other etching solutions and etching parameters known to a person skilled in the art can be used. Due to the masking effect of the patterned masking layer, e.g. the remaining traces at the first surface 12 of the substrate, e.g. silicon wafer 10, this etching step results in a textured front surface, as illustrated in FIG. 1($c$). Due to the absence of such patterned masking layer, e.g. traces at the second surface 14 of the wafer 10, the second surface 14 is polished and saw damage may be reduced or even completely removed. In addition, the etching step may at the same time also results in removal of the random mask.

As compared to prior art processes, the process of embodiments of the present invention can lead to a substantial reduction of the processing time with more than 50%, e.g. more than 70%, due to a combination of saw damage removal, front surface texturing and rear surface polishing in a single wet etching step. In addition the amount of substrate material, e.g. silicon, removed can be reduced with typically 50% as compared to the amount of substrate material, e.g. silicon, removed in prior art processes. Typically, in embodiments according to the present invention about 15 micrometer of substrate material, e.g. silicon, is removed.

In a method according to embodiments of the present invention, the natural roughness of an as-cut wafer can be used for the distribution of the masking material on one side. The roughness allows the masking effect to be localized.

The proposed technique has been applied on 20 Cz-Si (156 cm$^2$) wafers. The wafers have been processed using an advanced industrial process flow for high efficiency photovoltaic cells.

The Cz wafers had a resistivity of 1 Ohm-cm and a starting thickness of 150 micrometer. Square wafers of 12.5 cm×12.5 cm were used (substrate area 156 cm$^2$). The as-cut wafers were heated to 50° C., and an organic masking material was provided on a first surface of the wafers. A pressure roll was applied to ensure adequate coverage. Next the adhesive was removed at room temperature. Then a wet etching step was performed in a 1:5 NaOH:H$_2$O etching solution, at 80° C., for 4.5 minutes. This wet etching step removes saw damage and contaminants, and at the same time provides front side texturing and rear side polishing of the wafers. In addition, the wet etching step removes the traces of organic masking material.

Figure 2:
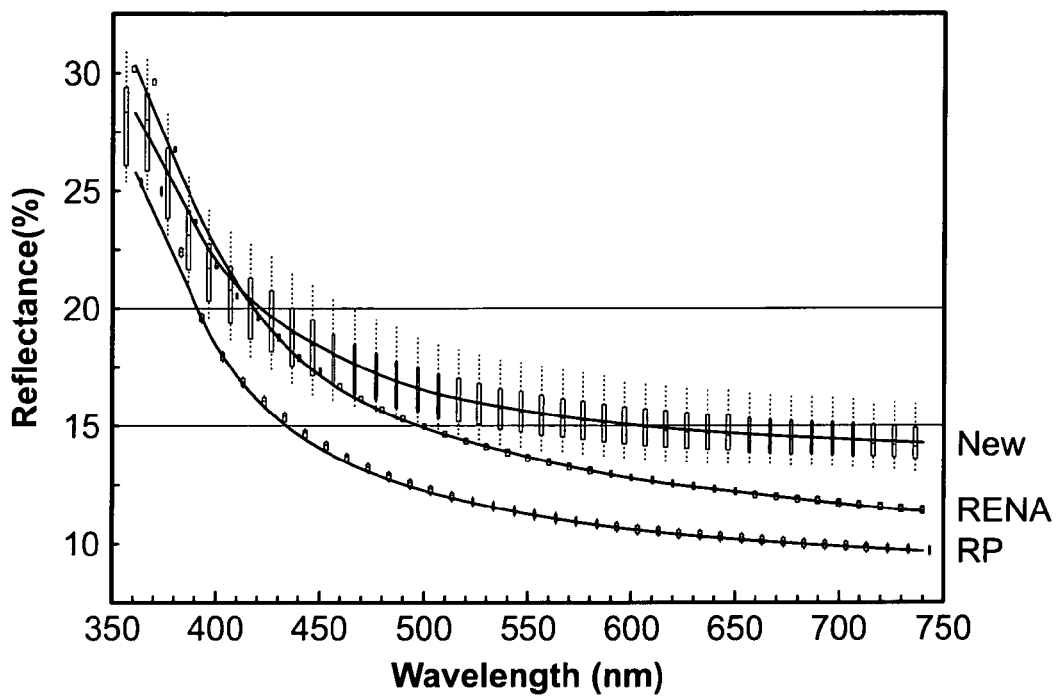
FIG. 2 shows the reflectivity measured at textured silicon surfaces obtained by different texturing methods.

A reflectance curve for differently textured semiconductor surfaces can be measured, for comparison reasons. As an example, the measured reflectance curve for differently textured monocrystalline silicon surfaces is depicted in FIG. 2. The reflectance at a textured surface obtained with a process of embodiments of the present invention (upper curve, 'new') is compared with the reflectance at a surface textured using a random pyramid process as described in the state of the art, based on etching in a KOH/IPA solution (lower curve 'RP' in FIG. 2), and with the reflectance at a surface textured using an industrial process provided by RENA (middle curve 'RENA' in FIG. 2). The results shown for the silicon surfaces textured with a method according to an embodiment of the present invention are based on measurements on 20 different wafers, with 9 measurement points on each wafer. The 'RP' and 'RENA' results are based on measurements on 2 wafers each, with 9 measurement points per wafer. The larger spread in the reflectance for wafers textured according to a method according to embodiments of the present invention as compared to the 'RP' and 'RENA' wafers may be related to a non-uniform coverage of the wafer by the adhesive providing the random mask. These results show that the reflectance at the silicon surface textured with a method according to embodiments of the present invention is sufficiently low: between 14% and 20% in the wavelength range from 425 nm to 750 nm.

After performing the etching step according to embodiments of the present invention for front side texturing and rear side polishing, the wafers were neutralized, in the example described in a hydrochloric solution. Next the wafers were cleaned and an emitter was formed on the front side, in the example described for example by using a standard 60 ohm/sq POCl$_3$ based diffusion process. The rear surface was then passivated, in the example described with a local Al-BSF (Back Surface Field) and a dielectric SiO$_2$/SiN stack. An antireflection coating, in the example described for example a SiN antireflection coating, was provided at the front side, for example by means of PECVD SiN. Laser ablation of a dot array pattern was performed on the rear side for providing vias through the dielectric stack. Aluminum was deposited at the rear side for forming rear side metal/semiconductor contacts and a silver paste was screen printed on the front side for forming front side metal/semiconductor contacts. Finally, a co-firing step was performed in a belt furnace to ensure ohmic contacts on the front side as well as a local BSF in the open areas of the dielectric stack.

Figure 3:
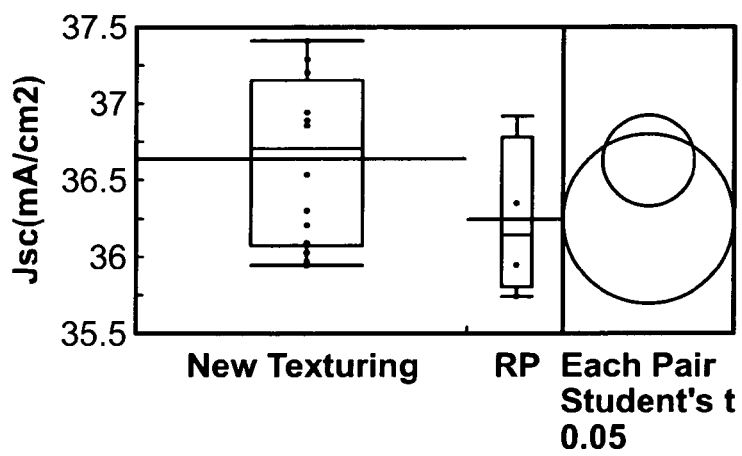
FIG. 3 shows the short-circuit current density $J_{sc}$ of a photovoltaic cell fabricated on a single side textured substrate using different texturing methods.
Figure 4:
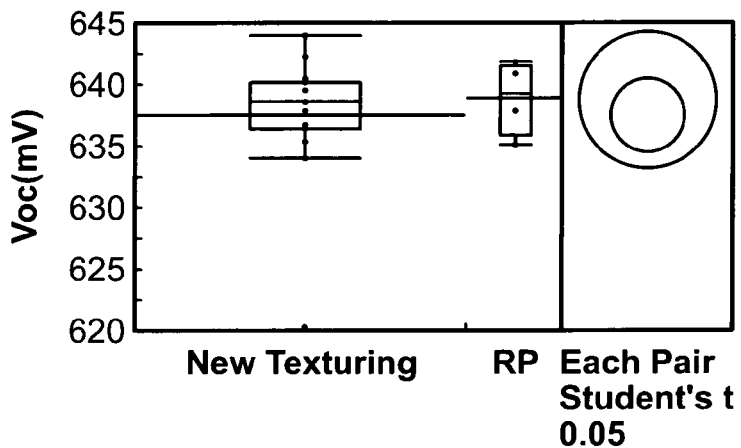
FIG. 4 shows the open-circuit voltage $V_{oc}$ of a photovoltaic cell fabricated on a single side textured substrate using different texturing methods.
Figure 5:
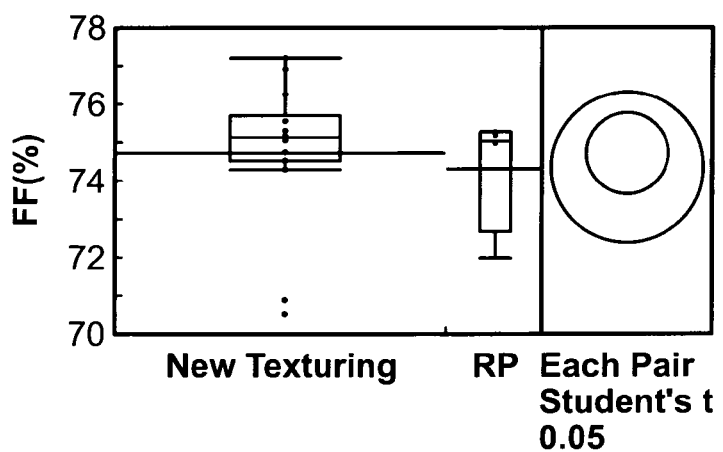
FIG. 5 shows the Fill Factor FF of a photovoltaic cell fabricated on a single side textured substrate using different texturing methods.
Figure 6:
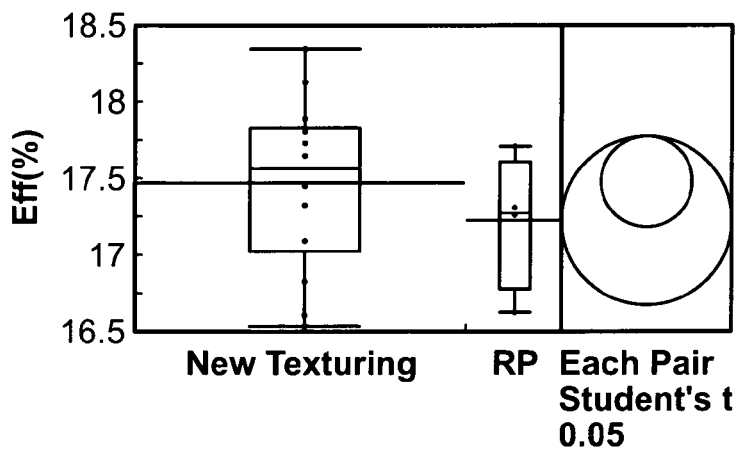
FIG. 6 shows the energy conversion efficiency $E_{ff}$ of a photovoltaic cell fabricated on a single side textured substrate using different texturing methods.

Cell results are depicted in FIGS. 3 to 6. The short-circuit current density $J_{sc}$ (FIG. 3), the open-circuit voltage $V_{oc}$ (FIG. 4), the Fill Factor FF (FIG. 5) and the energy conversion efficiency $E_{ff}$ (FIG. 6) are shown for cells textured using a method according to embodiments of the present invention and for cells textured using a prior art random pyramid process ('RP'). As illustrated in FIG. 3, the short circuit current density $J_{sc}$ of the photovoltaic cells textured using a method according to embodiments of the present invention is equivalent or slightly better than the short circuit current density $J_{sc}$ of the cells textured with prior art methods. The good Fill Factor FF and the good open circuit voltage $V_{oc}$ obtained for the cells textured according to embodiments of the present invention show that good contacts are obtained as well as a good surface passivation. An average energy conversion efficiency $E_{ff}$ of 17.5% was achieved, with a top efficiency of 18.4%. In FIG. 3 to FIG. 6 also the student's t-test results are illustrated for both test groups (prior art devices and devices according to embodiments of the present invention). The student's t-test is a way to show whether to sets of data are statistically different or not. In the results shown, the circles lie on top of each other, meaning that there is a 95% chance that the difference between the two sets of data is negligible. Thus the method according to embodiments of the present invention and the prior art method yield statistically the same results.

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A method for single side texturing of a substrate, the method comprising:
   providing an as-cut semiconductor wafer substrate comprising a first as-cut surface and a second as-cut surface opposite to one another with respect to the as-cut semiconductor wafer substrate;
   providing a masking layer with a random pattern on the first as-cut surface of the as-cut semiconductor wafer substrate; and etching the as-cut semiconductor wafer substrate in a polishing solution by texturing the first as-cut surface of the as-cut semiconductor wafer substrate and polishing the second as-cut surface of the as-cut semiconductor wafer substrate in a single etching step.

2. The method of claim 1, wherein providing an as-cut semiconductor wafer substrate comprises providing a crystalline semiconductor substrate.

3. The method of claim 1, wherein providing a masking layer with a random pattern on the first as-cut surface of the as-cut semiconductor wafer substrate comprises:
providing an adhesive layer on the first as-cut surface of the as-cut semiconductor wafer substrate; and
removing the adhesive layer from the first as-cut surface of the as-cut semiconductor wafer substrate, thereby leaving randomly distributed traces of the adhesive layer on the first as-cut surface, the randomly distributed traces of the adhesive layer forming the masking layer with the random pattern.

4. The method of claim 3, wherein the adhesive layer is an adhesive tape.

5. The method of claim 3, wherein providing an adhesive layer on the first as-cut surface of the as-cut semiconductor wafer substrate is conducted at room temperature.

6. The method of claim 3, wherein providing the adhesive layer on the first as-cut surface of the as-cut semiconductor wafer substrate comprises providing the adhesive layer from a roll-to-roll sheet.

7. The method of claim 3, wherein removing the adhesive layer from the first as-cut surface of the as-cut semiconductor wafer substrate comprises leaving traces of the adhesive layer on the first as-cut surface of the as-cut semiconductor wafer substrate.

8. The method of claim 7, wherein the traces of the adhesive layer on the first as-cut surface of the as-cut semiconductor wafer substrate are in a random pattern.

9. The method of claim 1, wherein providing a masking layer with a random pattern on the first as-cut surface of the as-cut semiconductor wafer substrate comprises spraying a masking layer on the first as-cut surface.

10. The method of claim 1, wherein the polishing solution is an alkaline polishing solution.

11. The method of claim 1, wherein etching as-cut semiconductor wafer substrate in a polishing solution is conducted at a temperature between 60° C. and 95° C.

12. The method of claim 1, wherein etching the as-cut semiconductor wafer substrate in a polishing solution is conducted at a temperature between 70° C. and 90° C.

13. The method of claim 1, wherein the as-cut semiconductor wafer substrate is etched in the polishing solution for an etching time between 1 minute and 45 minutes.

14. The method of claim 1, wherein the as-cut semiconductor wafer substrate is etched in the polishing solution for an etching time between 2 minutes and 30 minutes.

15. The method of claim 1, wherein the as-cut semiconductor wafer substrate is etched in the polishing solution for an etching time between 2 minutes and 10 minutes.

16. The method of claim 1, wherein the first as-cut surface and the second as-cut surface of the as-cut semiconductor wafer substrate are rough and contaminated with impurities when subject to the etching.

17. The method of claim 1, wherein etching the as-cut semiconductor wafer substrate provides a combination of saw damage removal, texturing of the first as-cut surface, and polishing of the second as-cut surface in a single step.

18. The method of claim 1, wherein a natural roughness of the as-cut semiconductor wafer substrate is used for the distribution of a masking material on the first as-cut surface, wherein the natural roughness allows a masking effect to be localized.

* * * * *

UNITED STATES PATENT AND TRADEMARK OFFICE
CERTIFICATE OF CORRECTION

| | |
|---|---|
| PATENT NO. | : 8,969,216 B2 |
| APPLICATION NO. | : 13/576925 |
| DATED | : March 3, 2015 |
| INVENTOR(S) | : Victor Prajapati et al. |

It is certified that error appears in the above-identified patent and that said Letters Patent is hereby corrected as shown below:

On the title page

In column 2 (page 1, item 56) at line 12, Under Other Publications, change "Advacnes" to --Advances--.

In column 1 (page 2, item 56) at line 5, Under Other Publications, change "$34^{\div}$" to --$34^{th}$--.

In the claims

In column 10 at line 7, In Claim 11, change "as-cut" to --the as-cut--.

In column 10 at line 25, In Claim 16, change "subject" to --subjected--.

Signed and Sealed this
Eighth Day of December, 2015

Michelle K. Lee
*Director of the United States Patent and Trademark Office*